US009172925B2

(12) United States Patent
Sugawara

(10) Patent No.: US 9,172,925 B2
(45) Date of Patent: Oct. 27, 2015

(54) SOLID STATE IMAGE CAPTURING ELEMENT, IMAGE CAPTURING APPARATUS, AND FOCUSING CONTROL METHOD

(71) Applicant: FUJIFILM Corporation, Tokyo (JP)

(72) Inventor: Kazufumi Sugawara, Saitama (JP)

(73) Assignee: FUJIFILM Corporation, Tokyo (JP)

( * ) Notice: Subject to any disclaimer, the term of this patent is extended or adjusted under 35 U.S.C. 154(b) by 22 days.

(21) Appl. No.: 14/229,287

(22) Filed: Mar. 28, 2014

(65) Prior Publication Data

US 2014/0211051 A1     Jul. 31, 2014

Related U.S. Application Data

(63) Continuation of application No. PCT/JP2012/070663, filed on Aug. 14, 2012.

(30) Foreign Application Priority Data

Sep. 29, 2011    (JP) .................................. 2011-215643

(51) Int. Cl.
*H04N 9/04*        (2006.01)
*H01L 27/146*     (2006.01)
*H04N 5/232*      (2006.01)
(Continued)

(52) U.S. Cl.
CPC .................. *H04N 9/045* (2013.01); *G02B 7/34* (2013.01); *H01L 27/14625* (2013.01); *H04N 5/23212* (2013.01); *H04N 5/3696* (2013.01)

(58) Field of Classification Search
CPC ... H04N 5/23212; H04N 5/3458; G03B 13/36
See application file for complete search history.

(56) References Cited

U.S. PATENT DOCUMENTS 6,819,360 B1 * 11/2004 Ide et al. ........................ 348/340
8,441,545 B2 * 5/2013 Hoda et al. ................. 348/222.1
8,687,080 B2 * 4/2014 Kawarada .................. 348/222.1
(Continued)

FOREIGN PATENT DOCUMENTS

| JP | 2008-312073 A | 12/2008 |
| JP | 2009-163229 A | 7/2009 |

(Continued)

OTHER PUBLICATIONS

Form PCT/ISA/237 of International Application No. PCT/JP2012/070663 dated Nov. 20, 2012.
(Continued)

*Primary Examiner* — Ahmed A Berhan
(74) *Attorney, Agent, or Firm* — Birch, Stewart, Kolasch & Birch, LLP.

(57) ABSTRACT

An image capturing element 5 has a phase difference detecting region 50a in a light receiving region 50 in which pixel cells are arranged, in the region 50a, some of pixel cells mounted with G filters, among the pixel cells which are arranged in a Bayer pattern, serve as phase difference detecting pixel cells 51R and 51L, the pixel cell 51L and the pixel cell 51R receive light which passes through different pupil areas of the image capturing lens 1, the pixel cell 51L includes two types of pixel cells (3) and (4) having different arrangement patterns of the adjacent pixel cells 51 and the pixel cell 51R includes two types of pixel cells (1) and (2) having different arrangement patterns of the adjacent pixel cells 51.

7 Claims, 10 Drawing Sheets

(51) Int. Cl.
*H04N 5/369* (2011.01)
*G02B 7/34* (2006.01)

(56) References Cited

U.S. PATENT DOCUMENTS

| | | |
|---|---|---|
| 2010/0091161 A1 | 4/2010 | Suzuki |
| 2010/0238343 A1 | 9/2010 | Kawarada |
| 2010/0245631 A1 | 9/2010 | Hoda et al. |
| 2011/0058070 A1 | 3/2011 | Awazu |
| 2011/0076001 A1 | 3/2011 | Iwasaki |

FOREIGN PATENT DOCUMENTS

| | | |
|---|---|---|
| JP | 2010-217618 A | 9/2010 |
| JP | 2010-220192 A | 9/2010 |
| JP | 2011-77829 A | 4/2011 |

OTHER PUBLICATIONS

PCT/ISA/210, mailed on Nov. 20, 2012, issued in PCT/JP2012/070663.

International Preliminary Report on Patentability (Form PCT/IPEA/416), dated Jan. 28, 2014, for International Application No. PCT/JP2012/070663.

Extended European Search Report, dated May 27, 2015, for European Application No. 12835789.4.

* cited by examiner

FIG. 4 PIXEL ARRANGEMENT OF AREAS A1 AND A2
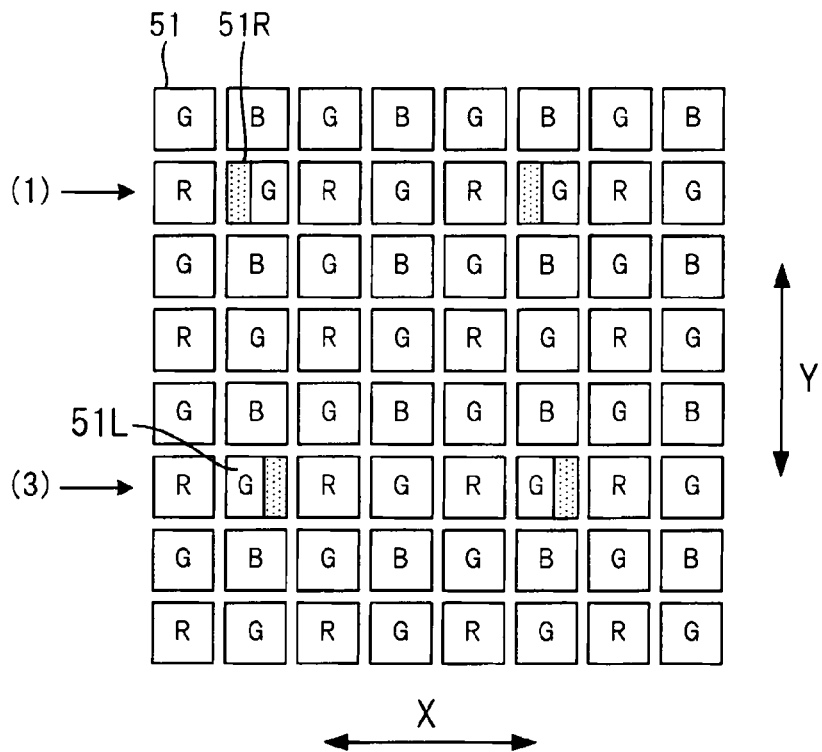
FIG. 5 PIXEL ARRANGEMENT OF AREAS B1 AND B2
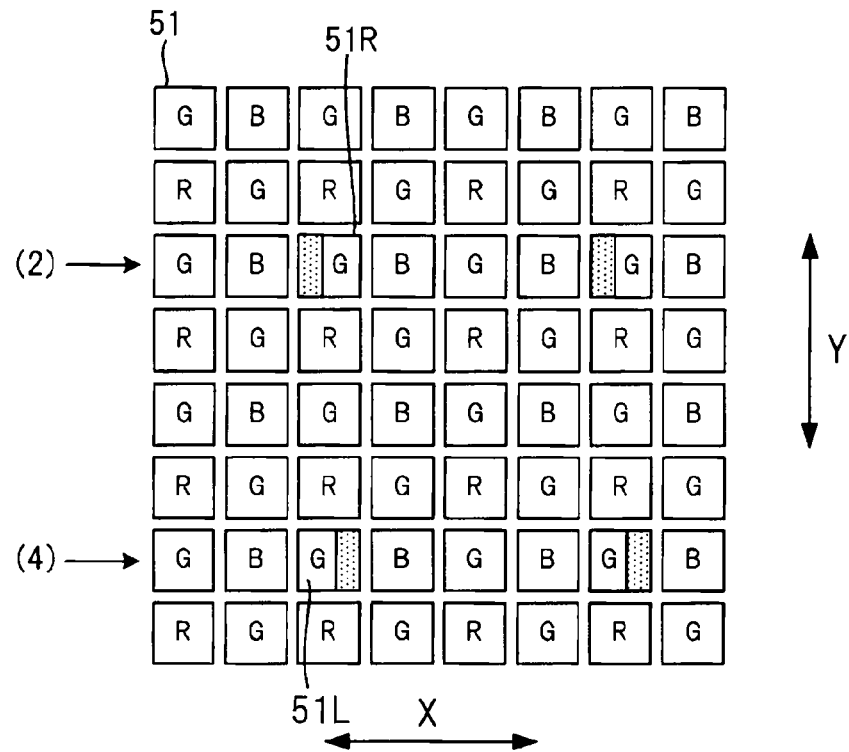

SOLID STATE IMAGE CAPTURING ELEMENT, IMAGE CAPTURING APPARATUS, AND FOCUSING CONTROL METHOD

CROSS REFERENCE TO RELATED APPLICATIONS

This is a continuation of International Application No. PCT/JP2012/070663 filed on Aug. 14, 2012, and claims priority from Japanese Patent Application No. 2011-215643, filed on Sep. 29, 2011, the entire disclosures of which are incorporated herein by reference.

TECHNICAL FIELD

The present invention relates to a solid state image capturing element, an image capturing apparatus, and a focusing control method.

BACKGROUND ART

Recently, as a resolution of a solid state image capturing element such as a CCD (charge coupled device) image sensor, and a CMOS (complementary metal oxide semiconductor) image sensor becomes higher, a demand for information device having an image capturing function such as a digital still camera, a digital video camera, a cellular phone, and a PDA (personal digital assistant) is suddenly increased.

Examples of a focusing control method which detects a distance to a main photographic subject to focus on the photographic subject include a contrast AF method and a phase difference AF (auto focus) method. The phase difference AF method may detect a focusing position with a high precision at a high speed as compared with the contrast AF method so that the phase difference AF method is largely adopted in various image capturing apparatuses. For example, Patent Document 1 discloses a color image capturing element in which image capturing pixel cells are two dimensionally arranged on a substrate of the image capturing element and pixel cells for phase difference detection are arranged therein in a predetermined layout.

CITATION LIST

Patent Literature

Patent Literature 1: JP-A-2009-163229

SUMMARY OF INVENTION

Technical Problem

However, as disclosed in Patent Document 1, in a color image capturing element in which the pixel cell for image capturing and the pixel cell for phase difference detection are mixed, light is leaked to the pixel cell for phase difference detection from the pixel cell for image capturing which is adjacent to the pixel cell for phase difference detection, so that the leaked light causes color mixture. The image capturing element disclosed in Patent Document 1 uses a pair of pixel cells for phase difference detection in which pixel cells configured to detect red light are arranged at both sides of one pixel cell for phase difference detection in a horizontal direction and pixel cells configured to detect blue light are arranged at both sides of the other pixel cell for phase difference detection in the horizontal direction, thereby detecting phase difference. Therefore, amounts of mixed color occurring in the pixel cells for phase difference detection which constitute the pair are different from each other and thus the difference in the amounts of mixed color significantly degrades accuracy of the phase difference detection. Further, the influence of the mixed color is also changed due to a color of the photographic subject so that the influence of the mixed color is hardly corrected.

The present invention has been made under the above described circumstances, and an object of the present invention is to provide a solid state image capturing element which prevents the accuracy of the phase difference detection from being degraded due to the influence of the mixed color, an image capturing apparatus including the same, and a focusing control method in the image capturing apparatus.

Solution to Problem

The present invention provides a solid state image capturing element in which a plurality of pixel cells each including a photoelectric converting unit is two dimensionally arranged, in which each of the plurality of pixel cells has a color filter which is formed above the photoelectric converting unit, and light which is transmitted through the color filters and is separated to at least three different colors, the plurality of pixel cells includes a plurality of image capturing pixel cells which receives a pair of light fluxes which pass through different pupil areas of an photographing optical system which is disposed at a stage preceding the solid state image capturing element, a plurality of phase difference detecting pixel cells which receives one of the light fluxes, and a plurality of phase difference detecting pixel cells which receives the other one of the light fluxes, the plurality of phase difference detecting pixel cells which receives said one of the light fluxes is divided into two types of a first phase difference detecting pixel cell and a second phase difference detecting pixel cell which have different arrangement patterns of the pixel cells adjacent to the phase difference detecting pixel cells, the plurality of phase difference detecting pixel cells which receives the other one of the light fluxes is divided into two types of a third phase difference detecting pixel cell and a fourth phase difference detecting pixel cell which have different arrangement patterns of the pixel cells adjacent to the phase difference detecting pixel cells, the arrangement pattern of the pixel cells adjacent to the first phase difference detecting pixel cell is the same as the arrangement pattern of the pixel cells adjacent to the third phase difference detecting pixel cell, and the arrangement pattern of the pixel cells adjacent to the second phase difference detecting pixel cell is the same as the arrangement pattern of the pixel cells adjacent to the fourth phase difference detecting pixel cell.

The present invention provides an image capturing apparatus, including: the solid state image capturing element; the photographing optical system; a phase difference information calculating unit which performs first processing which calculates phase difference information by a correlation operation between an output signal of the first phase difference detecting pixel cell and an output signal of the third phase difference detecting pixel cell, and second processing which calculates phase difference information by a correlation operation between an output signal of the second phase difference detecting pixel cell and an output signal of the fourth phase difference detecting pixel cell; and a focusing control unit which performs a focus control of the photographing optical system based on at least one of the phase difference information calculated by the first processing and the phase difference information calculated by the second processing.

The present invention provides a focusing control method in an image capturing element which includes the solid state image capturing element and the photographing optical system, the method including: a first phase difference information calculating step of calculating phase difference information by a correlation operation between an output signal of the first phase difference detecting pixel cell and an output signal of the third phase difference detecting pixel cell; a second phase difference information calculating step of calculating phase difference information by a correlation operation between an output signal of the second phase difference detecting pixel cell and an output signal of the fourth phase difference detecting pixel cell; and a focus controlling step of performing a focus control of the photographing optical system based on at least one of the phase difference information calculated by the first phase difference information calculating step and the phase difference information calculated by the second phase difference information calculating step.

Advantageous Effects of Invention

According to the present invention, it is possible to provide a solid state image capturing element which prevents the accuracy of the phase difference detection from being degraded due to the influence of the mixed color, an image capturing apparatus including the same, and a focusing control method in the image capturing apparatus.

BRIEF DESCRIPTION OF DRAWINGS

FIG. 4 is a partially enlarged view of the divided areas A1 and A2 illustrated in FIG. 3.

FIG. 5 is a partially enlarged view of the divided areas B1 and B2 illustrated in FIG. 3.

DESCRIPTION OF EMBODIMENTS

Hereinafter, exemplary embodiments of the present invention will be described with reference to the drawings.

First Exemplary Embodiment

Figure 1:
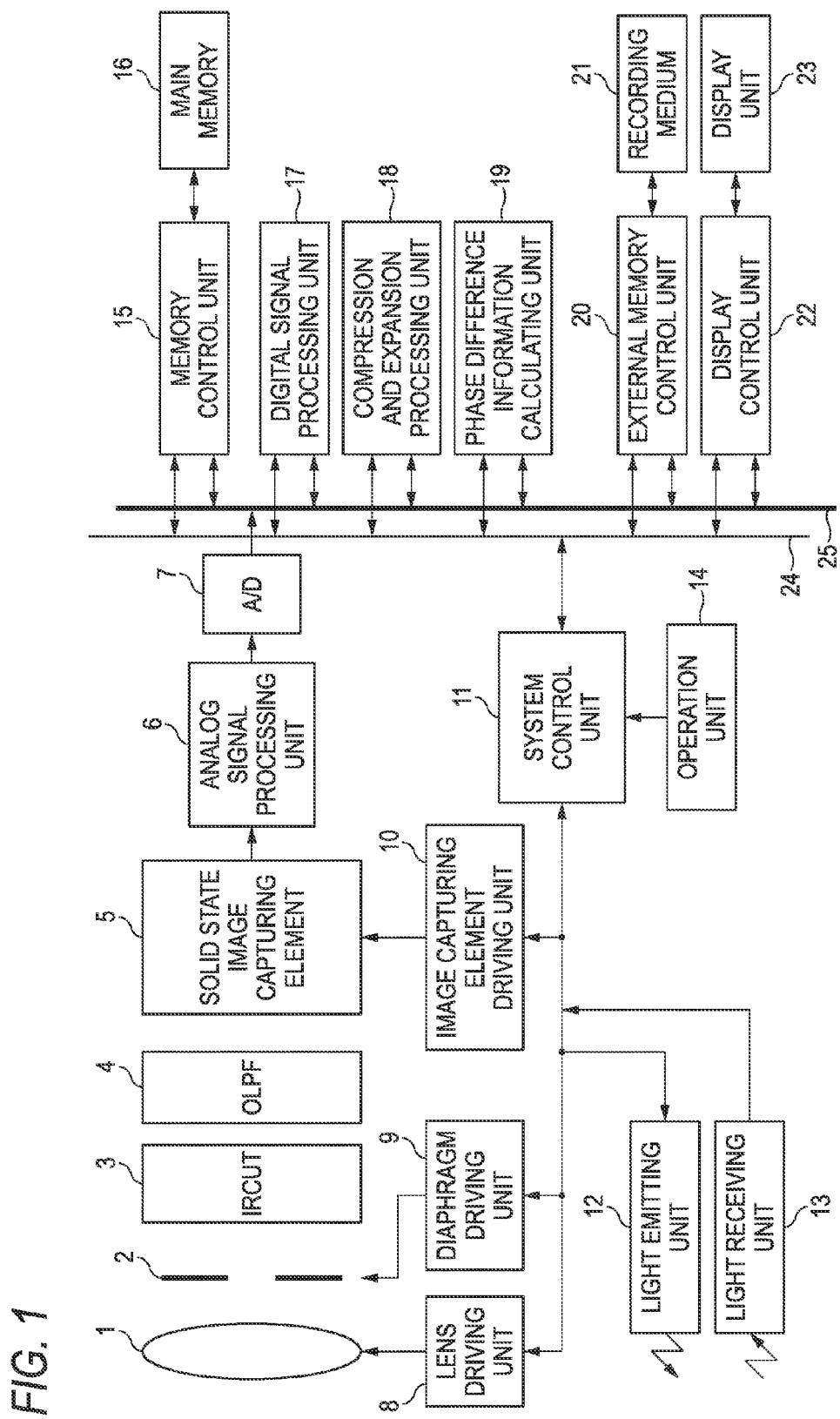
FIG. 1 is a view illustrating a schematic configuration of a digital camera as an example of an image capturing apparatus for explaining a first exemplary embodiment of the present invention.

FIG. 1 is a view illustrating a schematic configuration of a digital camera as an example of an image capturing apparatus for explaining a first exemplary embodiment of the present invention.

An imaging system of the illustrated digital camera includes an image capturing lens 1 as an photographing optical system, a CCD or MOS solid state image capturing element 5, a diaphragm 2 provided between the image capturing lens 1 and the solid state image capturing element 5, an infrared cut filter 3, and an optical low pass filter 4.

A system control unit 11 which generally controls the entire electrical control system of the digital camera controls a flash light emitting unit 12 and a light receiving unit 13. Further, the system control unit 11 controls a lens driving unit 8 to adjust a position of a focusing lens which is included in the image capturing lens 1 or a position of a zoom lens which is included in the image capturing lens 1. Further, the system control unit 11 controls an open amount of the diaphragm 2 through a diaphragm driving unit 9 to adjust an exposure amount.

Further, the system control unit 11 drives the solid state image capturing element 5 through an image capturing element driving unit 10 to output a photographic subject image captured through the image capturing lens 1 as a captured image signal. An instruction signal from a user is input to the system control unit 11 through an operation unit 14.

The electrical control system of the digital camera further includes an analog signal processing unit 6 which is connected to an output of the solid state image capturing element 5 and performs analog signal processing such as correlated double sampling processing, and an A/D converting circuit 7 which converts an RGB color signal output from the analog signal processing unit 6 into a digital signal. The analog signal processing unit 6 and the A/D converting circuit 7 are controlled by the system control unit 11.

Further, the electrical control system of the digital camera includes a main memory 16, a memory control unit 15 which is connected to the main memory 16, a digital signal processing unit 17 which performs an interpolation operation, a gamma correction operation, and an RGB/YC conversion processing to create captured image data, a compression and expansion processing unit 18 which compresses the captured image data created in the digital signal processing unit 17 into a JPEG format or expands the compressed image data, a phase difference information calculating unit 19 which calculates phase difference information using a signal which is read out from a pixel cell for phase difference detection included in the solid state image capturing element 5, an external memory control unit 20 to which a detachable recording medium 21 is connected, and a display control unit 22 to which a display unit 23 mounted on a rear surface of the camera is connected. The memory control unit 15, the digital signal processing unit 17, the compression and expansion processing unit 18, the phase difference information calculating unit 19, the external memory control unit 20, and the display control unit 22 are connected to each other by a control bus 24 and a data bus 25 to be controlled by a command from the system control unit 11.

Figure 2:
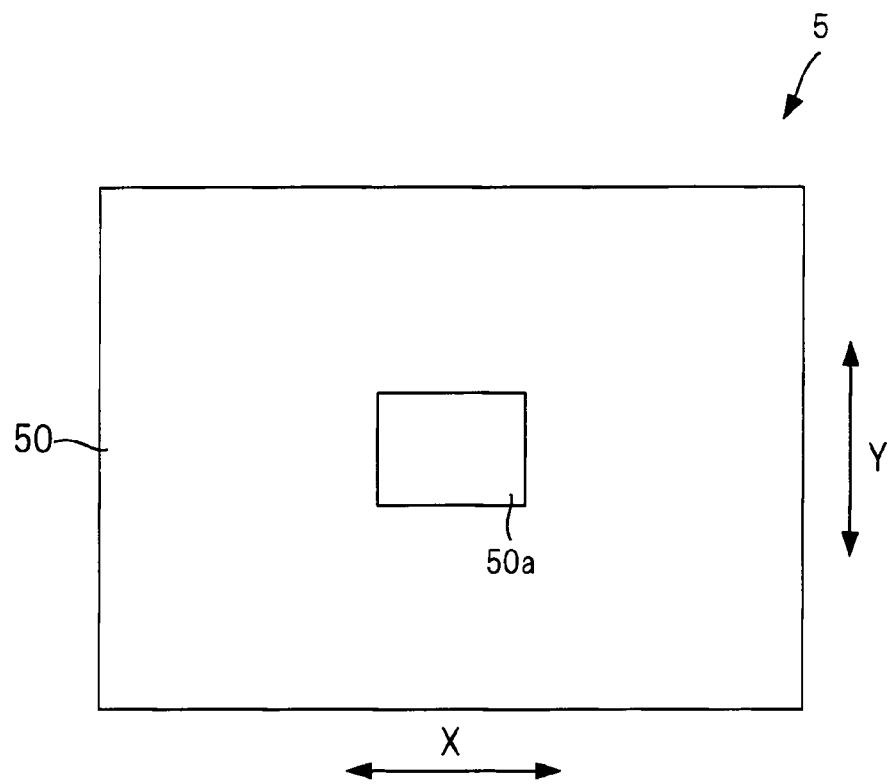
FIG. 2 is a plan schematic view illustrating a schematic configuration of a solid state image capturing element 5 which is mounted in the digital camera illustrated in FIG. 1.

FIG. 2 is a plan schematic view illustrating a schematic configuration of a solid state image capturing element 5 which is mounted in the digital camera illustrated in FIG. 1.

The solid state image capturing element 5 illustrated in FIG. 2 includes a light receiving region 50 in which a plurality of pixel cells is two dimensionally (here, in a square lattice shape) arranged in a row direction X and a column direction Y perpendicular thereto. Each pixel cell includes a photoelectric converting unit which converts light into an electric charge, and a color filter which is laminated above the photoelectric converting unit.

Further, the plurality of pixel cells includes a plurality of image capturing pixel cells which receives a pair of light fluxes which pass through a pupil area of the image capturing lens 1 which is disposed at a front stage of the solid state image capturing element 5, at least four phase difference detecting pixel cells which receive one of the pair of light fluxes, and at least four phase difference detecting pixel cells which receive the other one of the pair of the light fluxes.

In the light receiving region 50, a rectangular phase difference detecting region 50a configured to detect an amount (phase difference) of shifted image of a photographic subject is provided. The phase difference detecting region 50a is a region where the phase difference detecting pixel cells are disposed. Even though only one phase difference detecting region 50a is provided in an example of FIG. 2, a plurality of phase difference detecting regions may be provided. Alternatively, the overall light receiving region 50 may serve as the phase difference detecting region 50a.

Figure 3:
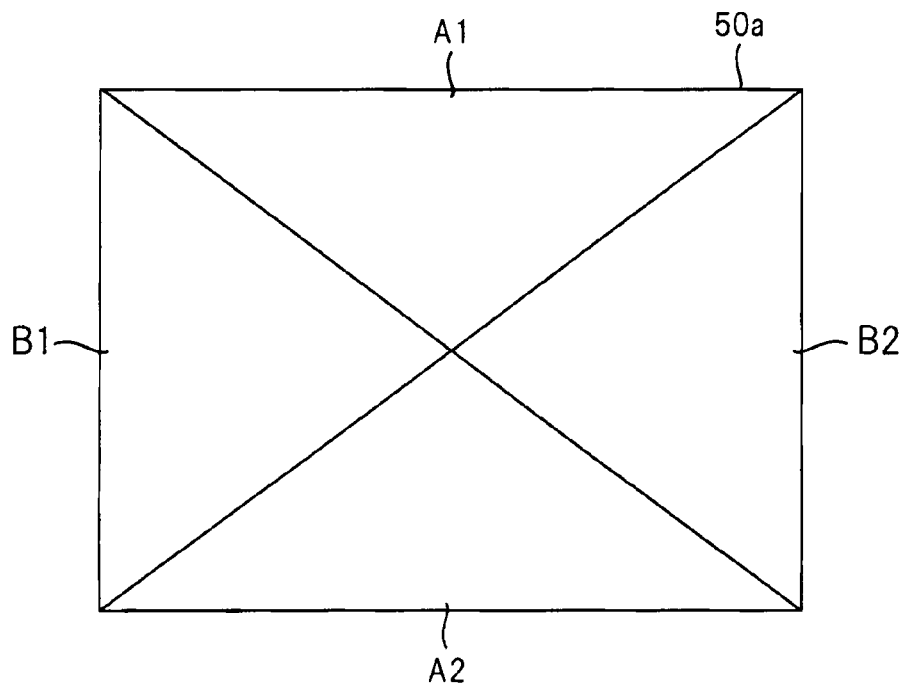
FIG. 3 is a view illustrating a phase difference detecting region 50a of the solid state image capturing element 5 illustrated in FIG. 2 which is divided into four areas A1, A2, B1, and B2 by two diagonal lines.

FIG. 3 is a view illustrating a phase difference detecting region 50a of the solid state image capturing element 5 illustrated in FIG. 2 which is divided into four areas A1, A2, B1, and B2 by two diagonal lines.

FIG. 4 is a partially enlarged view of the divided areas A1 and A2 illustrated in FIG. 3.

As illustrated in FIG. 4, a plurality of pixel cells (illustrated in FIG. 4 as a square block denoted by any one of the characters "R", "G", and "B") is arranged in the divided areas A1 and A2 in a square lattice shape. In FIG. 4, a pixel cell mounted with a color filter (hereinafter, referred as an R filter) which transmits red (R) light is denoted by a character "R". Further, a pixel cell mounted with a color filter (hereinafter, referred as a G filter) which transmits green (G) light is denoted by a character "G". Furthermore, a pixel cell mounted with a color filter (hereinafter, referred as a B filter) which transmits blue (B) light is denoted by a character "B". As illustrated in FIG. 4, the color filters which are mounted in the solid state image capturing element 5 are arranged in a Bayer pattern.

In the divided areas A1 and A2, among the pixel cells mounted with the G filters, some pixel cells at both sides of each of which pixel cells mounted with the R filters are arranged in the row direction X serve as phase difference detecting pixel cells 51L and 51R. Pixel cells other than the phase difference detecting pixel cells 51L and 51R serve as image capturing pixel cells 51. As illustrated in FIG. 4, a plurality of phase difference detecting pixel cells 51L or a plurality of phase difference detecting pixel cells 51R is disposed in a separate row and periodically disposed in each row.

The image capturing pixel cell 51 is a pixel cell which receives both a pair of light fluxes (light fluxes which pass through a left side and a right side with respect to a primary axis of the image capturing lens 1) which pass through the pupil area of the image capturing lens 1.

The phase difference detecting pixel cell 51R is a pixel which receives one of the pair of light fluxes (a light flux which passes through one side (in this case, a right side) with respect to the primary axis of the image capturing lens 1) which pass through the pupil area of the image capturing lens 1. When compared with the image capturing pixel cell 51, the phase difference detecting pixel cell 51R has a photoelectric converting unit with a reduced opening area because a left end of an opening of the photoelectric converting unit is shielded from the light. In the phase difference detecting pixel cell 51R of FIG. 4, a hatched area is blocked from the light and the opening of the photoelectric converting unit of the phase difference detecting pixel cell 51R is eccentric to the right side.

The phase difference detecting pixel cell 51L is a pixel which receives the other one of the pair of light fluxes (a light flux which passes through the other side (in this case, the left side) with respect to the primary axis of the image capturing lens 1) which pass through the pupil area of the image capturing lens 1. When compared with the image capturing pixel cell 51, the phase difference detecting pixel cell 51L has a photoelectric converting unit with a reduced opening area because a right end of an opening of the photoelectric converting unit is shielded from the light. In the phase difference detecting pixel cell 51L of FIG. 4, a hatched area is blocked from the light and the opening of the photoelectric converting unit of the phase difference detecting pixel cell 51L is eccentric to the left side.

Further, in this specification, a pixel cell which is adjacent to a certain pixel cell indicates a pixel cell having a center from which a distance to a center of a certain pixel cell is shortest. That is, in FIG. 4, the pixel cells which are adjacent to the phase difference detecting pixel cell 51R do not include pixel cells which are arranged at an upper right, a lower right, an upper left, and a lower left of the phase difference detecting pixel cell 51R.

As illustrated in FIG. 4, the divided areas A1 and A2 include the plurality of phase difference detecting pixel cells 51L and the plurality of phase difference detecting pixel cells 51R. The pixel cells 51 mounted with the R filters are arranged at both sides in the row direction X of the plurality of phase difference detecting pixel cells 51R and the pixel cells 51 mounted with the B filters are arranged at both sides in the column direction Y thereof. Further, the pixel cells 51 mounted with the R filters are arranged at both sides in the row direction X of the plurality of phase difference detecting pixel cells 51L and the pixel cells 51 mounted with the B filters are arranged at both sides in the column direction Y thereof.

That is, the phase difference detecting pixel cell 51R and the phase difference detecting pixel cell 51L which are arranged in the divided areas A1 and A2 have the same arrangement pattern of the image capturing pixel cells 51 which are adjacent thereto.

FIG. 5 is a partially enlarged view of the divided areas B1 and B2 illustrated in FIG. 3. In FIG. 5, the positions of the phase difference detecting pixel cell 51R and the phase difference detecting pixel cell 51L illustrated in FIG. 4 are shifted to the lower right direction.

As illustrated in FIG. 5, the divided areas B1 and B2 include the phase difference detecting pixel cells 51L and the phase difference detecting pixel cells 51R. The pixel cells 51 mounted with the B filters are arranged at both sides in the row direction X of the plurality of phase difference detecting pixel cells 51R and the pixel cells 51 mounted with the R filters are arranged at both sides in the column direction Y thereof. The pixel cells 51 mounted with the B filters are arranged at both sides in the row direction X of the plurality of phase difference detecting pixel cells 51L and the pixel cells 51 mounted with the R filters are arranged at both sides in the column direction Y thereof.

That is, the phase difference detecting pixel cell 51R and the phase difference detecting pixel cell 51L which are arranged in the divided areas B1 and B2 have the same arrangement pattern of the image capturing pixel cells 51 which are adjacent thereto.

As illustrated in FIGS. 4 and 5, there are two types of phase difference detecting pixel cells 51R included in the solid state image capturing element 5, which have different arrangement patterns of the image capturing pixel cells 51 which are adjacent thereto. Hereinafter, the phase difference detecting pixel cell 51R illustrated in FIG. 4 is referred to as a phase difference detecting pixel cell 51R(1). In FIG. 4, a line in which the phase difference detecting pixel cells 51R(1) are arranged is denoted with a reference symbol (1). Further, the phase difference detecting pixel cell 51R illustrated in FIG. 5 is referred to as a phase difference detecting pixel cell 51R(2). In FIG. 5, a line in which the phase difference detecting pixel cells 51R(2) are arranged is denoted with a reference symbol (2).

Similarly, there are two types of the phase difference detecting pixel cells 51L included in the solid state image capturing element 5, which have different arrangement patterns of image capturing pixel cells 51 which are adjacent thereto. Hereinafter, the phase difference detecting pixel cell 51L illustrated in FIG. 4 is referred to as a phase difference detecting pixel cell 51L(3). In FIG. 4, a line in which the phase difference detecting pixel cells 51L(3) are arranged is denoted with a reference symbol (3). Further, the phase difference detecting pixel cell 51L illustrated in FIG. 5 is referred to as a phase difference detecting pixel cell 51L(4). In FIG. 5, a line in which the phase difference detecting pixel cells 51L(4) are arranged is denoted with a reference symbol (4).

Next, a focusing control method of the image capturing lens 1 which is performed by the digital camera illustrated in FIG. 1 will be described. Hereinafter, it is assumed that the solid state image capturing element 5 has a characteristic in that an amount of mixed color from the pixel cell mounted with the R filter to the pixel cell mounted with the G filter is larger than an amount of mixed color from the pixel cell mounted with the B filter to the pixel cell mounted with the G filter.

First, when an instruction of AF is performed through the operation unit 14, the system control unit 11 performs provisional imaging by the solid state image capturing element 5. After completing the provisional imaging, signals are read out from, for example, all of the pixel cells of the solid state image capturing element 5 by the image capturing element driving unit 10 to be temporarily stored in the main memory 16.

Next, the phase difference information calculating unit 19 obtains signals which are output from the phase difference detecting pixel cells 51R(1), 51R(2), 51L(3), and 51L(4) in the phase difference detecting region 50a, among signals stored in the main memory 16.

Figure 6:
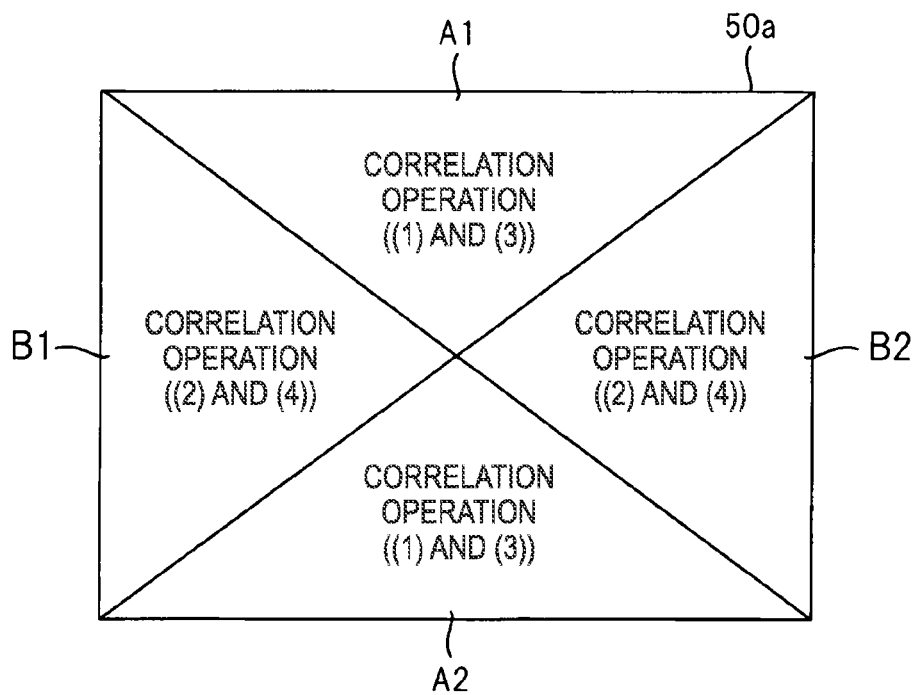
FIG. 6 is a view illustrating a correlation operation method which is performed by a phase difference information calculating unit 19 of the digital camera according to the first exemplary embodiment.

Next, the phase difference information calculating unit 19, as illustrated in FIG. 6, performs a correlation operation between an output signal of the phase difference detecting pixel cell 51R(1) in the divided area A1 and an output signal of the phase difference detecting pixel cell 51L(3) in the divided area A1 to calculate a phase difference amount in the divided area A1, performs a correlation operation between an output signal of the phase difference detecting pixel cell 51R(1) in the divided area A2 and an output signal of the phase difference detecting pixel cell 51L(3) in the divided area A2 to calculate a phase difference amount in the divided area A2, performs a correlation operation between an output signal of the phase difference detecting pixel cell 51R(2) in the divided area B1 and an output signal of the phase difference detecting pixel cell 51L(4) in the divided area B1 to calculate a phase difference amount in the divided area B1, and performs a correlation operation between an output signal of the phase difference detecting pixel cell 51R(2) in the divided area B2 and an output signal of the phase difference detecting pixel cell 51L(4) in the divided area B2 to calculate a phase difference amount in the divided area B2.

Next, the phase difference information calculating unit 19 uses the phase difference amounts which are calculated for the divided areas A1, A2, B1, and B2 to calculate phase difference information in the phase difference detecting region 50a. For example, the phase difference information calculating unit 19 calculates an average of the phase difference amounts which are calculated for the divided areas A1, A2, B1, and B2 and the average is considered as the phase difference information in the phase difference detecting region 50a.

When the phase difference information in the phase difference detecting region 50a is calculated, the system control unit 11 determines a focusing position of the image capturing lens 1 based on the phase difference information and performs focusing control to move the image capturing lens 1 in accordance with the focusing position.

The divided areas A1 and A2 of the phase difference detecting region 50a are areas in which a direction of oblique light which causes color mixture in the phase difference detecting pixel cell is the column direction Y. Further, pixel cells 51 mounted with the B filters are arranged at both sides in the column direction Y of the phase difference detecting pixel cell 51R(1) and the phase difference detecting pixel cell 51L(3) in the divided areas A1 and A2. Therefore, a mixed color component, which is incident in the phase difference detecting pixel cell 51R(1) and the phase difference detecting pixel cell 51L(3) by the oblique light, is blue.

The divided areas B1 and B2 of the phase difference detecting region 50a are areas in which a direction of oblique light which causes color mixture in the phase difference detecting pixel cell is the row direction X. Further, pixel cells 51 mounted with the B filters are arranged at both sides in the row direction X of the phase difference detecting pixel cell 51R(2)

and the phase difference detecting pixel cell 51L(4) in the divided areas B1 and B2. Therefore, a mixed color component, which is incident in the phase difference detecting pixel cell 51R(2) and the phase difference detecting pixel cell 51L(4) by the oblique light, is blue.

That is, according to the digital camera illustrated in FIG. 1, phase difference information which is calculated for the phase difference detecting region 50a may be calculated without being influenced by an amount of red color mixture. Therefore, accuracy of calculating phase difference information may be improved to precisely perform the focus control.

Further, an arrangement of the pixel cells in the phase difference detecting region 50a of the solid state image capturing element 5 is not limited to the square lattice arrangement, but a known arrangement may be applied.

Second Embodiment

A digital camera according to a second exemplary embodiment has the same configuration as the digital camera illustrated in FIG. 1, except for the configuration of the solid state image capturing element 5 and a phase difference information calculating method by the phase difference information calculating unit 19. A solid state image capturing element 5 which is mounted in the digital camera according to the second exemplary embodiment has another pixel arrangement in the divided areas illustrated in FIG. 3.

Figure 7:
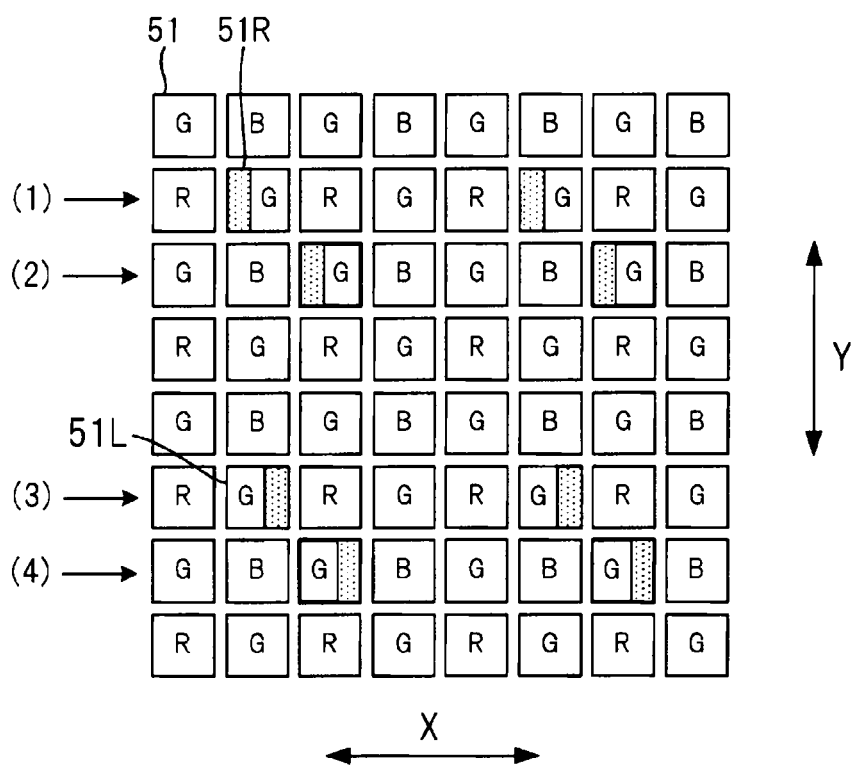
FIG. 7 is a view illustrating pixel arrangement in the divided areas A1, A2, B1, and B2 illustrated in FIG. 3 in a solid state image capturing element mounted in a digital camera according to a second exemplary embodiment.

FIG. 7 is a view illustrating pixel arrangement in the divided areas A1, A2, B1, and B2 illustrated in FIG. 3 in a solid state image capturing element mounted in a digital camera according to a second exemplary embodiment. According to the solid state image capturing element 5 which is mounted in the digital camera according to the second exemplary embodiment, in the divided areas A1, A2, B1, and B2, a plurality of phase difference detecting pixel cells 51R(1) illustrated in FIG. 4, a plurality of phase difference detecting pixel cells 51L(3) illustrated in FIG. 4, a plurality of phase difference detecting pixel cells 51R(2) illustrated in FIG. 5, and a plurality of phase difference detecting pixel cells 51L(4) illustrated in FIG. 5 are periodically arranged.

Next, a focusing control method of an image capturing lens 1 which is performed by the digital camera according to the second exemplary embodiment will be described.

When provisional imaging by the solid state image capturing element 5 is completed and a captured image signals are stored in a main memory 16, a phase difference information calculating unit 19 determines a color tone of a photographic subject which is provisionally imaged based on the captured image signals.

For example, the phase difference information calculating unit 19 compares an average Ra of signals obtained from the pixel cells 51 mounted with R filters, and an average Ba of signals obtained from the pixel cells 51 mounted with B filters, among the captured image signals. When Ra>Ba, it is determined that the photographic subject has a strong red tone and when Ra<Ba, it is determined that the photographic subject has a strong blue tone.

Figure 8:
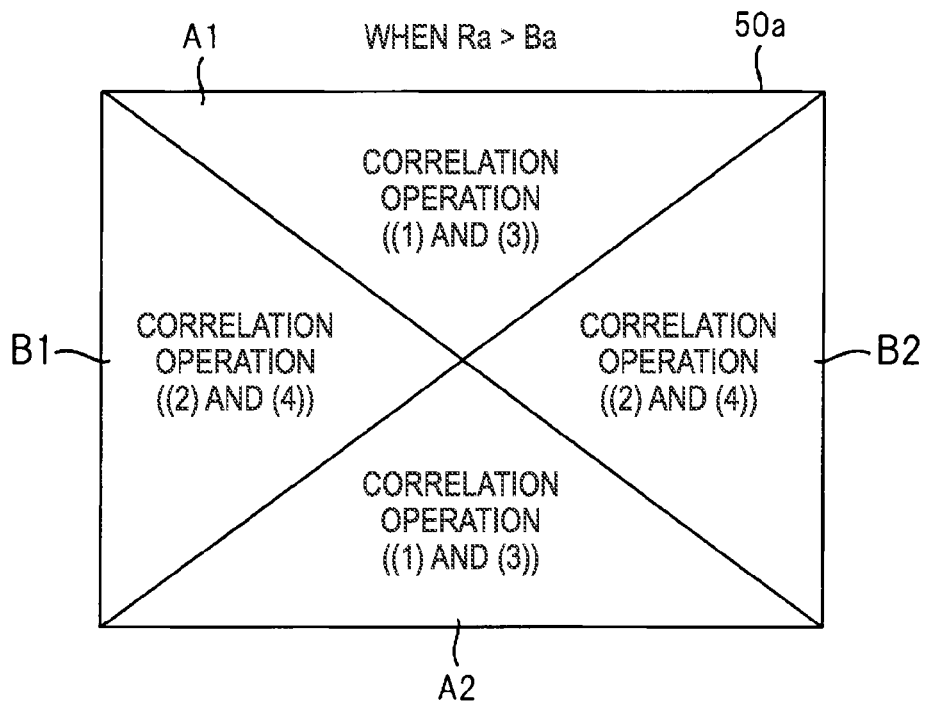
FIG. 8 is a view illustrating a correlation operation method which is performed by a phase difference information calculating unit 19 of the digital camera according to the second exemplary embodiment.

When Ra>Ba, the phase difference information calculating unit 19, as illustrated in FIG. 8, performs a correlation operation between an output signal of the phase difference detecting pixel cell 51R(1) in the divided area A1 and an output signal of the phase difference detecting pixel cell 51L(3) in the divided area A1 to calculate a phase difference amount in the divided area A1. Further, the phase difference information calculating unit 19 performs a correlation operation between an output signal of the phase difference detecting pixel cell 51R(1) in the divided area A2 and an output signal of the phase difference detecting pixel cell 51L(3) in the divided area A2 to calculate a phase difference amount in the divided area A2. Further, the phase difference information calculating unit 19 performs a correlation operation between an output signal of the phase difference detecting pixel cell 51R(2) in the divided area B1 and an output signal of the phase difference detecting pixel cell 51L(4) in the divided area B1 to calculate a phase difference amount in the divided area B1. Further, the phase difference information calculating unit 19 performs a correlation operation between an output signal of the phase difference detecting pixel cell 51R(2) in the divided area B2 and an output signal of the phase difference detecting pixel cell 51L(4) in the divided area B2 to calculate a phase difference amount in the divided area B2.

Figure 9:
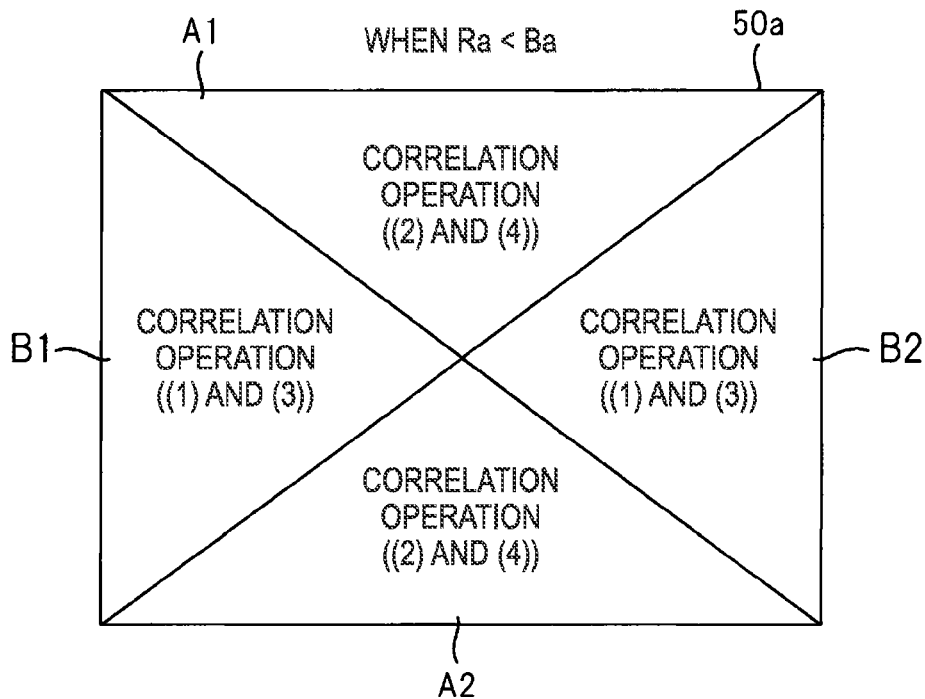
FIG. 9 is a view illustrating a correlation operation method which is performed by the phase difference information calculating unit 19 of the digital camera according to the second exemplary embodiment.

When Ra<Ba, the phase difference information calculating unit 19, as illustrated in FIG. 9, performs a correlation operation between an output signal of the phase difference detecting pixel cell 51R(2) in the divided area A1 and an output signal of the phase difference detecting pixel cell 51L(4) in the divided area A1 to calculate a phase difference amount in the divided area A1. Further, the phase difference information calculating unit 19 performs a correlation operation between an output signal of the phase difference detecting pixel cell 51R(2) in the divided area A2 and an output signal of the phase difference detecting pixel cell 51L(4) in the divided area A2 to calculate a phase difference amount in the divided area A2. Further, the phase difference information calculating unit 19 performs a correlation operation between an output signal of the phase difference detecting pixel cell 51R(1) in the divided area B1 and an output signal of the phase difference detecting pixel cell 51L(3) in the divided area B1 to calculate a phase difference amount in the divided area B1. Further, the phase difference information calculating unit 19 performs a correlation operation between an output signal of the phase difference detecting pixel cell 51R(1) in the divided area B2 and an output signal of the phase difference detecting pixel cell 51L(3) in the divided area B2 to calculate a phase difference amount in the divided area B2.

Next, the phase difference information calculating unit 19 uses the phase difference amounts which are calculated for the divided areas A1, A2, B1, and B2, for example, to calculate an average and the average is considered as the phase difference information in the phase difference detecting region 50a.

When the phase difference information in the phase difference detecting region 50a is calculated, the system control unit 11 determines a focusing position of the image capturing lens 1 based on the phase difference information and performs the focus control to move the image capturing lens 1 in accordance with the focusing position.

As described above, when using the solid state image capturing element in which the phase difference detecting pixel cells 51R(1), 51R(2), 51L(3), and 51L(4) are periodically arranged in the divided areas A1, A2, B1, and B2 illustrated in FIG. 3, an optimal correlation operation may be performed for every divided area in accordance with a color tone of the photographic subject and a position of the divided area.

For example, when a photographic subject having a strong red tone is imaged, the correlation operation may be performed with output signals of the phase difference detecting pixel cells which are not affected by red color mixture in the divided area. When a photographic subject having a strong blue tone is imaged, the correlation operation may be performed with output signals of the phase difference detecting pixel cells which are not affected by blue color mixture in the divided area. Therefore, the phase difference information in which the influence due to the color mixture is suppressed to be minimized may be calculated, thereby improving accuracy of focusing control.

Further, when due to a structure of the solid state image capturing element 5 which is mounted in the digital camera according to the second exemplary embodiment, the color mixture is hardly generated in the column direction Y (for example, when an MOS circuit which is included in a pixel cell is disposed between pixel cells in the column direction Y and the color mixture is prevented by the MOS circuit), the phase difference information for the phase difference detecting region 50a may be calculated as described below.

That is, when Ra>Ba, the phase difference information calculating unit 19 performs a correlation operation between an output signal of the phase difference detecting pixel cell 51R(2) in the divided areas and an output signal of the phase difference detecting pixel cell 51L(4) in the divided areas to calculate a phase difference amount and calculates an average of the phase difference amounts as phase difference information for the phase difference detecting region 50a.

Further, when Ra<Ba, the phase difference information calculating unit 19 performs a correlation operation between an output signal of the phase difference detecting pixel cell 51R(1) in the divided areas and an output signal of the phase difference detecting pixel cell 51L(3) in the divided areas to calculate a phase difference amount and calculates an average of the phase difference amounts as phase difference information for the phase difference detecting region 50a.

By doing this, an influence of the color mixture is reduced in the phase difference information calculated for the phase difference detecting region 50a so that the focusing control with high precision may be allowed.

Further, in a case where due to a structure of the solid state image capturing element 5 which is mounted in the digital camera according to the second exemplary embodiment, the color mixture is hardly generated in the row direction X, when Ra>Ba, the phase difference information calculating unit 19 performs the correlation operation between the output signal of the phase difference detecting pixel cell 51R(1) in the divided areas and the output signal of the phase difference detecting pixel cell 51L(3) in the divided areas. Further, when Ra<Ba, the phase difference information calculating unit 19 performs the correlation operation between the output signal of the phase difference detecting pixel cell 51R(2) in the divided areas and the output signal of the phase difference detecting pixel cell 51L(4) in the divided areas.

Third Embodiment

A digital camera according to a third exemplary embodiment has the same configuration as the digital camera illustrated in FIG. 1, except that the solid state image capturing element 5 is changed into a solid state image capturing element 5' and another phase difference information calculating method is used by a phase difference information calculating unit 19.

Figure 10:
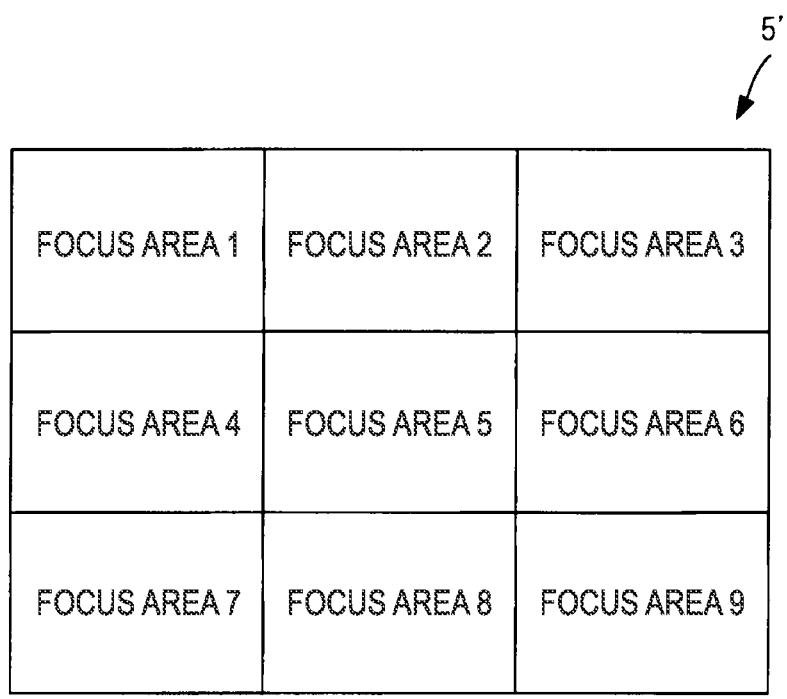
FIG. 10 is a plan schematic view of a solid state image capturing element 5' which is mounted in a digital camera according to a third exemplary embodiment.

FIG. 10 is a plan schematic view of a solid state image capturing element 5' which is mounted in a digital camera according to a third exemplary embodiment. The solid state image capturing element 5', as illustrated in FIG. 10, may set nine focus areas 1 to 9. At least one phase difference detecting region 50a illustrated in FIG. 1 is provided in each of the focus areas 1 to 9 and the pixel arrangement in divided areas A1, A2, B1, and B2 of the phase difference detecting region 50a is as illustrated in FIG. 7.

The phase difference information calculating unit 19 of the digital camera according to the third exemplary embodiment determines a color tone of a photographic subject which is captured in a focus area based on signals obtained from pixel cells in the focus area designated by a user, among the focus areas 1 to 9. When the photographic subject has a strong red tone, the phase difference information calculating unit 19 performs a correlation operation as illustrated in FIG. 8 in the phase difference detecting region 50a of the focus area to calculate phase difference information. In contrast, when the photographic subject has a strong blue tone, the phase difference information calculating unit 19 performs a correlation operation as illustrated in FIG. 9 in the phase difference detecting region 50a of the focus area to calculate phase difference information.

As described above, according to the digital camera according to the third exemplary embodiment, a color tone of the photographic subject is determined for every focus area to calculate phase difference information. Accordingly, focusing control with high precision in which influence of the color mixture for every focus area is reduced is possible.

Further, the pixel arrangement in the divided areas A1, A2, B1, and B2 of the phase difference detecting region 50a in each of the focus areas 1 to 9 may be the same as illustrated in FIGS. 4 and 5. In this case, the phase difference information calculating unit 19 may perform a correlation operation as illustrated in FIG. 6 on the phase difference detecting region 50a in the focus area, regardless of the color tone of the photographic subject, to calculate the phase difference information.

Fourth Exemplary Embodiment

A digital camera according to a fourth exemplary embodiment has the same configuration as the digital camera illustrated in FIG. 1, except that an arrangement of pixel cells included in the solid state image capturing element 5 is changed and another phase difference information calculating method is used by a phase difference information calculating unit 19.

In the solid state image capturing element which is mounted in the digital camera according to the fourth exemplary embodiment, an arrangement of a plurality of pixel cells which is included in the light receiving region 50 illustrated in FIG. 1 has a so-called honeycomb arrangement in which a plurality of lines each of which includes a plurality of pixel cells extending in a row direction X at a predetermined pitch is arranged in a column direction Y to be parallel to each other, and odd-numbered lines and even-numbered lines are shifted by half an arrangement pitch of the row direction X of the pixel cells in the row direction X in the lines.

Figure 11:
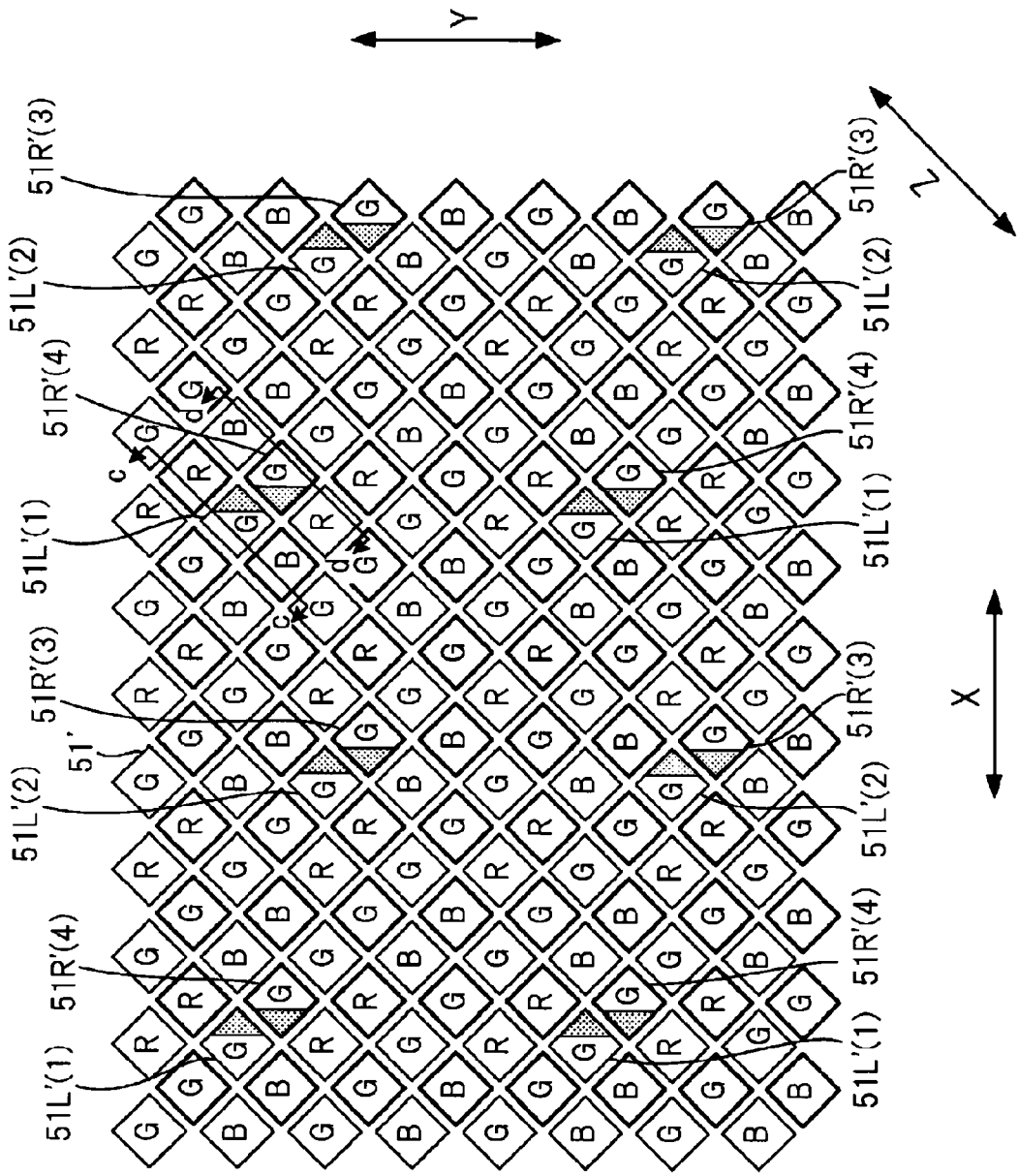
FIG. 11 is a view illustrating pixel arrangement in the divided areas A1, A2, B1, and B2 illustrated in FIG. 3 in a solid state image capturing element mounted in a digital camera according to a fourth exemplary embodiment.

FIG. 11 is a view illustrating a pixel arrangement in the divided areas A1, A2, B1, and B2 illustrated in FIG. 3 in the solid state image capturing element mounted in the digital camera according to the fourth exemplary embodiment. In FIG. 11, a square block denoted by any one of reference characters "R", "G," and "B" indicates a pixel cell. Even in FIG. 11, similarly to FIG. 4, a pixel cell mounted with an R filter is denoted by "R", a pixel cell mounted with a G filter is denoted by "G", and a pixel cell mounted with a B filter is denoted by "B".

As illustrated in FIG. 11, an arrangement of color filters, which are mounted in the pixel cells in the odd-numbered lines of the solid state image capturing element mounted in the digital camera according to the fourth exemplary embodiment, is a Bayer arrangement. Further, an arrangement of the color filters which are mounted in the pixel cells in the even-numbered lines of the solid state image capturing element also has the Bayer arrangement.

By the above color filter arrangement, the pixel cells in the even-numbered lines, which detect light having the same color as the pixel cells in the odd-numbered line, are arranged so as to be adjacent to the pixel cells in the odd-numbered lines at the inclined lower right side. With this configuration, an image obtained by imaging in the odd-numbered line and an image obtained by imaging in the even-numbered line may be combined to achieve a high sensitivity or exposure time in the odd-numbered line and exposure time in the even-numbered line may be changed and the image obtained by imaging in the odd-numbered line and the image obtained by imaging in the even-numbered line may be combined to expand a dynamic range.

In the plurality of pixel cells illustrated in FIG. 11, some of pixel cells mounted with the G filters serve as a phase difference detecting pixel cell 51L'(1) and a phase difference detecting pixel cell 51R'(3), in which a pixel cell mounted with the B filter is arranged to be adjacent to the left side of each of the pixel cells mounted with the G filters in a Z direction, a pixel cell mounted with the R filter is arranged to be adjacent to the right side in the Z direction, and pixel cells mounted with the G filters are arranged to be adjacent to both sides in a direction which is orthogonal to the Z direction.

Further, some of pixel cells mounted with the G filters serve as a phase difference detecting pixel cell 51L'(2) and a phase difference detecting pixel cell 51R'(4), in which a pixel cell mounted with the R filter is arranged to be adjacent to the left side of each of the pixel cells mounted with the G filters in a Z direction, a pixel cell mounted with the B filter is arranged to be adjacent to the right side in the Z direction, and pixel cells mounted with the G filters are arranged to be adjacent to both sides in a direction which is orthogonal to the Z direction.

Further, pixel cells other than the phase difference detecting pixel cells 51L'(1), 51L'(2), 51R'(3), and 51R'(4) serve as image capturing pixel cells 51'.

The phase difference detecting pixel cells 51L'(1) and 51L'(2) have the same function as the phase difference detecting pixel cell 51L. Further, the phase difference detecting pixel cells 51R'(3) and 51R'(4) have the same function as the phase difference detecting pixel cell 51R. Further, the image capturing pixel cell 51' has the same function as the pixel cell 51.

In the respective divided areas, a plurality of phase difference detecting pixel cells 51L'(1), a plurality of phase difference detecting pixel cells 51L'(2), a plurality of phase difference detecting pixel cells 51R'(3), and a plurality of phase difference detecting pixel cells 51R'(4) are arranged in separate rows and periodically arranged in the separate rows in the row direction X.

Figure 12:
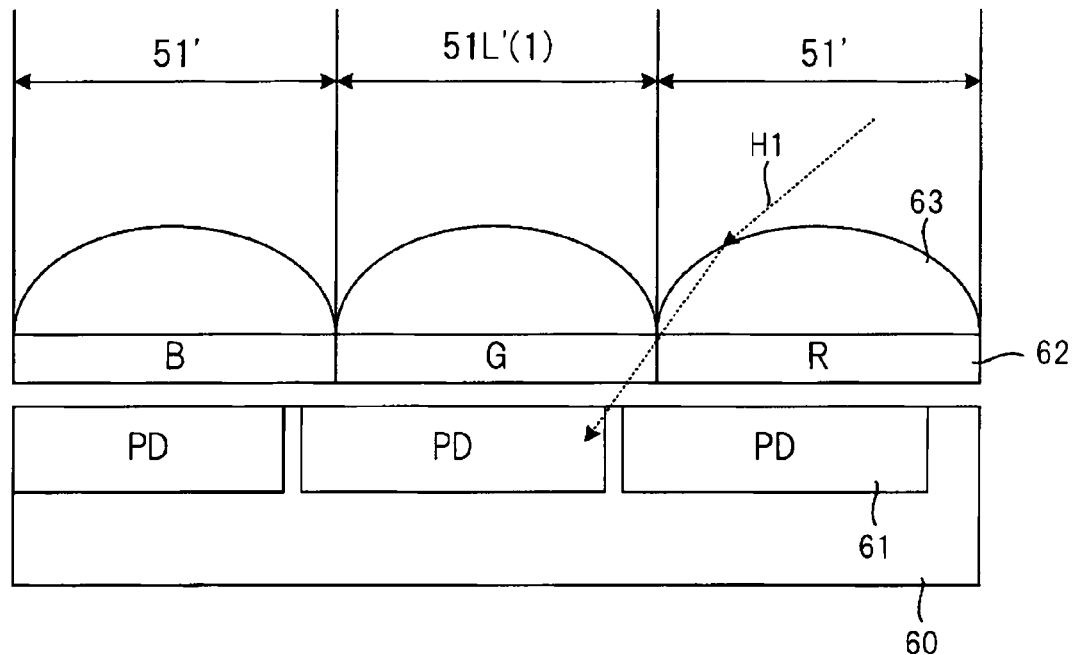
FIG. 12 is a cross-sectional schematic view taken along line c-c of FIG. 11 when it is assumed that the enlarged part illustrated in FIG. 11 is disposed, for example, at a left end of the divided area B1 of FIG. 3.
Figure 13:
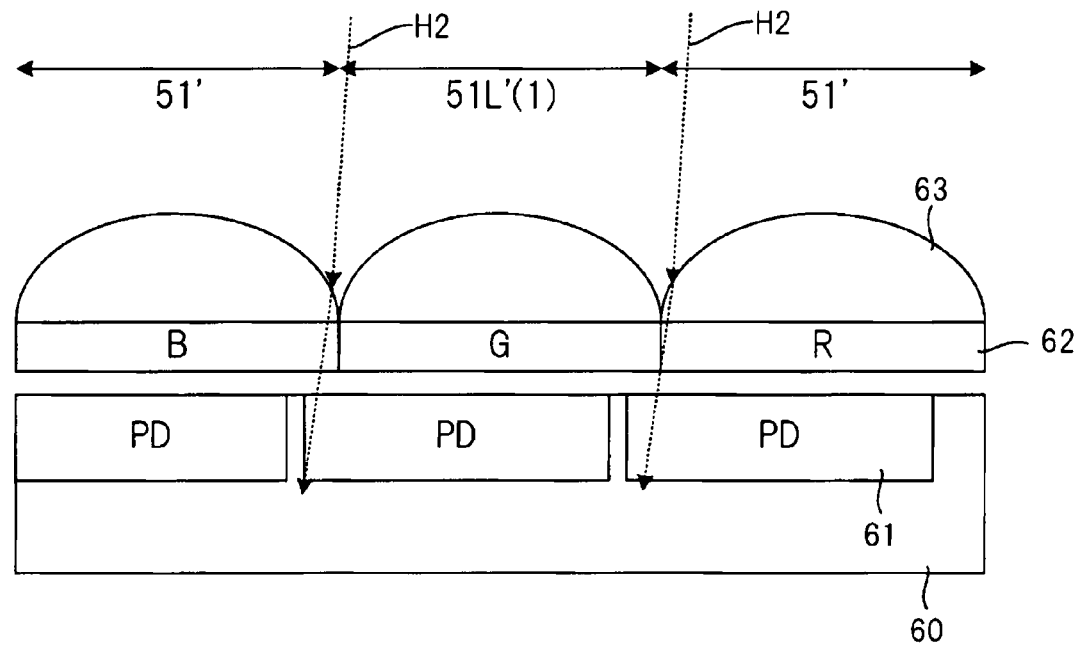
FIG. 13 is a cross-sectional schematic view taken along line c-c of FIG. 11 when it is assumed that the enlarged part illustrated in FIG. 11 is disposed, for example, at a left end of the divided area B1 of FIG. 3.

FIGS. 12 and 13 are cross-sectional schematic views taken along line c-c of FIG. 11 when it is assumed that the enlarged part illustrated in FIG. 11 is disposed, for example, at ends of the divided areas B1 and A2 of FIG. 3. Further, FIGS. 14 and 15 are cross-sectional schematic views taken along line d-d of FIG. 11 when it is assumed that the enlarged part illustrated in FIG. 11 is disposed, for example, at ends of the divided areas B1 and A2 of FIG. 3.

Figure 14:
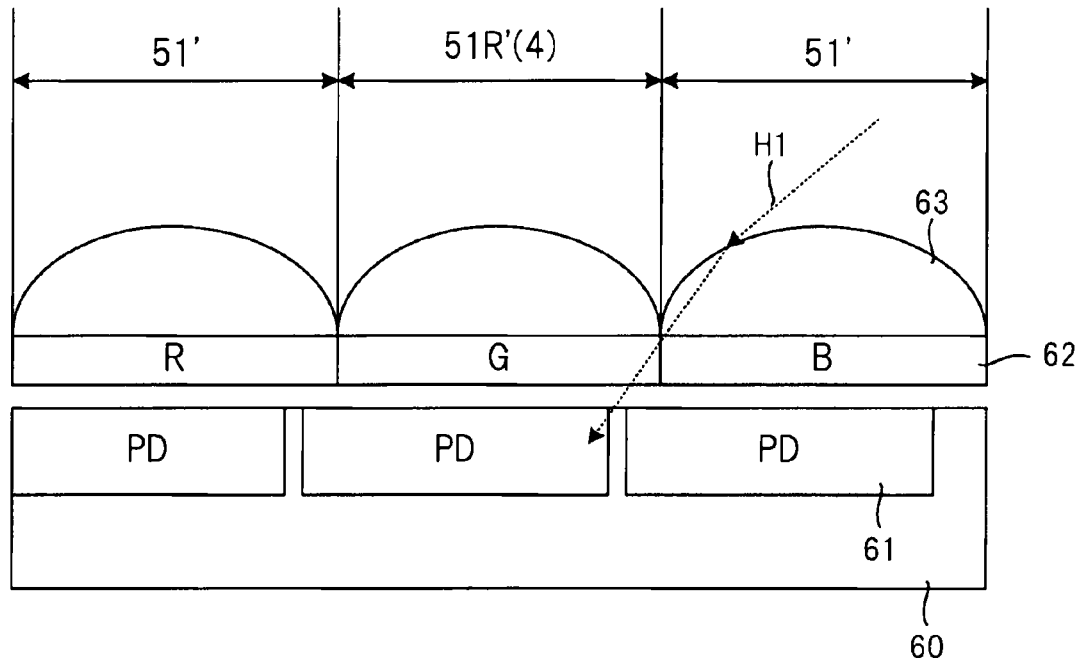
FIG. 14 is a cross-sectional schematic view taken along line d-d of FIG. 11 when it is assumed that the enlarged part illustrated in FIG. 11 is disposed, for example, at a left end of the divided area B1 of FIG. 3.
Figure 15:
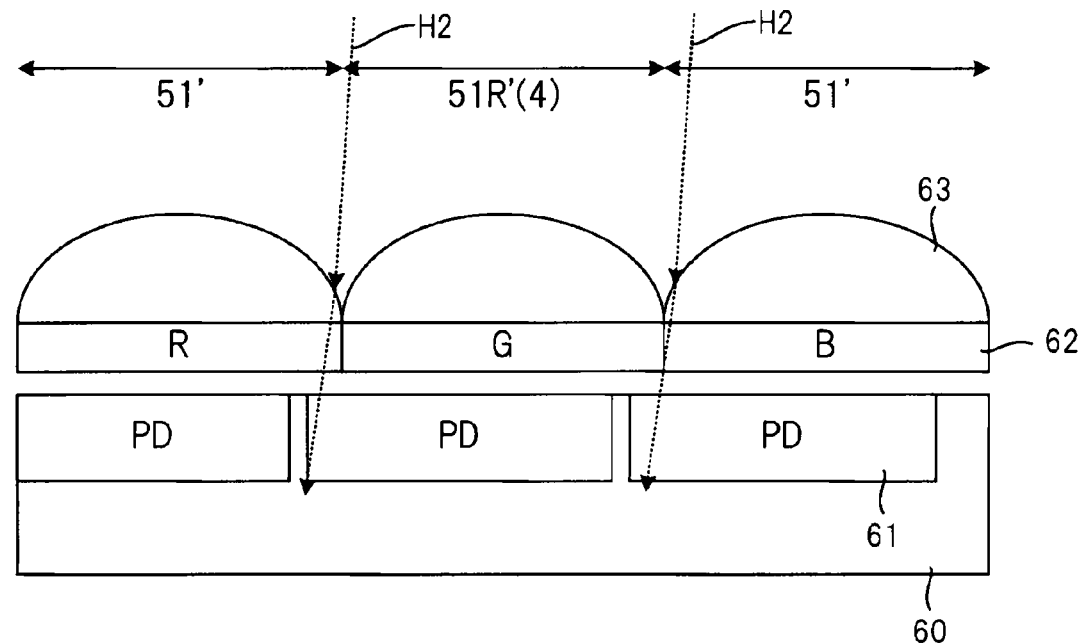
FIG. 15 is a cross-sectional schematic view taken along line d-d of FIG. 11 when it is assumed that the enlarged part illustrated in FIG. 11 is disposed, for example, at a left end of the divided area B1 of FIG. 3.

As illustrated in FIGS. 12 to 14, a color filter 62 is provided in each of the pixel cells and a micro lens 63 is provided on the color filter 62. A photodiode (PD) 61 as a photoelectric converting unit which is formed in a semiconductor substrate 60 is formed below the color filter 62. A center of the PD 61 of each pixel cell is shifted from a center (a center of the pixel cell) of the micro lens 63 included in the pixel cell, so as to get away from a center of the solid state image capturing element. As described above, a configuration in which the position of the PD 61 is shifted to the periphery as the position of the PD 61 is directed from the center of the solid state image capturing element to the periphery is a general configuration which is adopted in order to reduce the shading.

When a position of a zoom lens included in the image capturing lens 1 which is mounted in the digital camera is at a wide angle side or the diaphragm 2 is at an open angle side, an incident angle of light which is incident onto the pixel cells illustrated in FIGS. 12 to 14 becomes steep. Therefore, as illustrated in FIG. 12, oblique light H1 having a steep incident angle, which is incident onto the pixel cell 51' mounted with the R filter, passes through the R filter and then reaches the PD 61 of the adjacent phase difference detecting pixel cell 51L'(1) to generate mixture of a red color component in the phase difference detecting pixel cell 51L'(1).

In contrast, when the position of the zoom lens included in the image capturing lens 1 is at a telescopic side or the diaphragm 2 is set to be a small diaphragm, the incident angle of light which is incident onto the pixel cells illustrated in FIGS. 12 to 14 is gentle. Therefore, as illustrated in FIG. 13, oblique light H2 having a gentle incident angle, which is incident onto the pixel cell 51' mounted with the R filter, passes through the R filter, but is not incident onto the PD 61 of the phase difference detecting pixel cell 51L'(1). In the meantime, the oblique light H2, which is incident onto the pixel cell 51' mounted with the B filter, passes through the B filter and then is incident onto the PD 61 of the phase difference detecting pixel cell 51L'(1) to generate mixture of a blue color component in the phase difference detecting pixel cell 51L'(1)

Further, as illustrated in FIG. 14, oblique light H1 having a steep incident angle, which is incident onto the pixel cell 51' mounted with the B filter, passes through the B filter and then reaches the PD 61 of the adjacent phase difference detecting pixel cell 51R'(4) to generate mixture of a blue color component in the phase difference detecting pixel cell 51R'(4).

Furthermore, as illustrated in FIG. 15, oblique light H2 having a gentle incident angle, which is incident onto the pixel cell 51' mounted with the B filter, passes through the B filter, but is not incident onto the PD 61 of the phase difference detecting pixel cell 51R'(4). In the meantime, the oblique light H2, which is incident onto the pixel cell 51' mounted with the R filter, passes through the R filter and then is incident onto the PD 61 of the phase difference detecting pixel cell 51R'(4) to generate mixture of a red color component in the phase difference detecting pixel cell 51R'(4).

Further, a path in the phase difference detecting pixel cell 51L'(2) illustrated in FIG. 11 where the color mixture is generated is the same as that in the phase difference detecting pixel cell 51R'(4) which has the same arrangement pattern of the adjacent pixel cells 51' in the Z direction as the phase difference detecting pixel cell 51L'(2). Further, a path in the phase difference detecting pixel cell 51R'(3) illustrated in FIG. 11 where the color mixture is generated is the same as that in the phase difference detecting pixel cell 51L'(1) which has the same arrangement pattern of the adjacent pixel cells 51' in the Z direction as the phase difference detecting pixel cell 51R'(3).

Further, cross-sectional views at an end of the solid state image capturing element in the divided area A1 and the divided area B2 are the same as the cross-sectional views of FIGS. 12 to 15 when the inside of the substrate 60 and the incident ray are mirror-reversed. Therefore, in the divided area A1 and the divided area B2, when an incident angle in the phase difference detecting pixel cells 51L'(1) and 51L'(3) is large (wide angle imaging), blue color mixture is generated, and when the incident angle is small (telescopic imaging), red color mixture is generated. Further, when an incident angle in the phase difference detecting pixel cells 51R'(2) and 51R'(4)

is large (wide angle imaging), red color mixture is generated, and when the incident angle is small (telescopic imaging), blue color mixture is generated.

As described above, in the solid state image capturing element mounted in the digital camera according to the fourth exemplary embodiment, even in the same phase difference detecting pixel cell, a color component of the color mixture which is generated in the phase difference detecting pixel cell changes depending on the incident angle of the light incident onto the solid state image capturing element, and a position of the divided area in which the pixel cell is arranged.

A phase difference information calculating unit 19 of the digital camera according to the fourth exemplary embodiment calculates phase difference information, as described below, in consideration of the above phenomenon.

Figure 16:
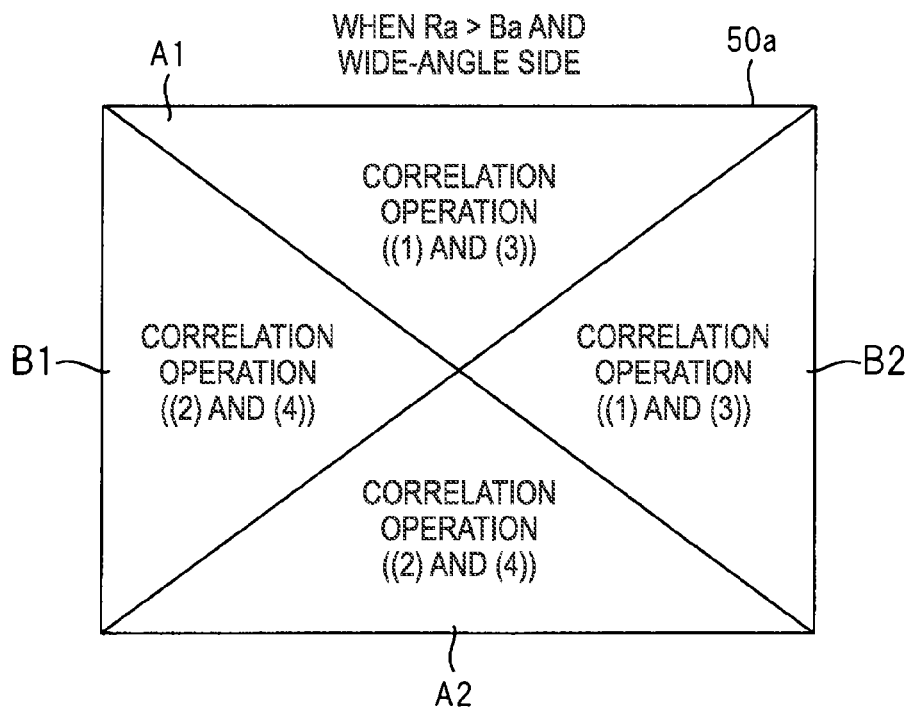
FIG. 16 is a view illustrating a correlation operation method which is performed by the phase difference information calculating unit 19 of the digital camera according to the second exemplary embodiment.

That is, when an imaged photographic subject has a strong red tone (Ra>Ba) and an incident angle of the light, which is incident onto the solid state image capturing element, is larger than a threshold value, the phase difference information calculating unit 19, as illustrated in FIG. 16, performs a correlation operation between an output signal of the phase difference detecting pixel cell 51L'(2) and an output signal of the phase difference detecting pixel cell 51R'(4) in the divided area B1 to calculate a phase difference amount for the divided area B1. Further, the phase difference information calculating unit 19 performs a correlation operation between an output signal of the phase difference detecting pixel cell 51L'(1) and an output signal of the phase difference detecting pixel cell 51R'(3) in the divided area B2 to calculate a phase difference amount for the divided area B2. Further, the phase difference information calculating unit 19 performs a correlation operation between an output signal of the phase difference detecting pixel cell 51L'(1) and an output signal of the phase difference detecting pixel cell 51R'(3) in the divided area A1 to calculate a phase difference amount for the divided area A1. Further, the phase difference information calculating unit 19 performs a correlation operation between an output signal of the phase difference detecting pixel cell 51L'(2) and an output signal of the phase difference detecting pixel cell 51R'(4) in the divided area A2 to calculate a phase difference amount for the divided area A2.

Figure 17:
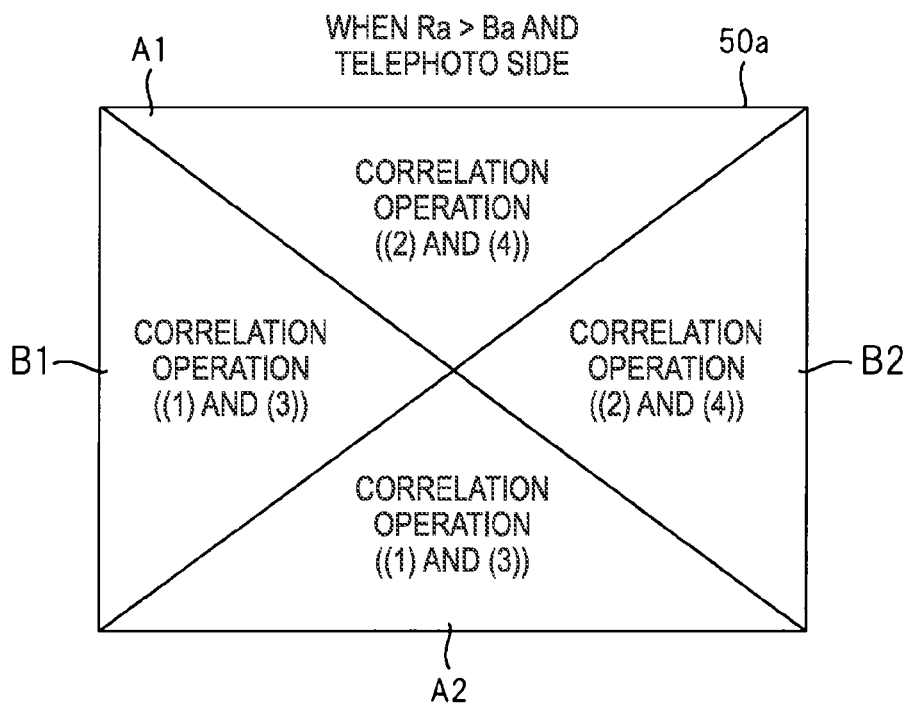
FIG. 17 is a view illustrating a correlation operation method which is performed by the phase difference information calculating unit 19 of the digital camera according to the second exemplary embodiment.

When an imaged photographic subject has a strong red tone (Ra>Ba) and an incident angle of the light, which is incident onto the solid state image capturing element, is equal to or smaller than a threshold value, the phase difference information calculating unit 19, as illustrated in FIG. 17, performs a correlation operation between an output signal of the phase difference detecting pixel cell 51L'(1) and an output signal of the phase difference detecting pixel cell 51R'(3) in the divided area B1 to calculate a phase difference amount for the divided area B1. Further, the phase difference information calculating unit 19 performs a correlation operation between an output signal of the phase difference detecting pixel cell 51L'(2) and an output signal of the phase difference detecting pixel cell 51R'(4) in the divided area B2 to calculate a phase difference amount for the divided area B2. Further, the phase difference information calculating unit 19 performs a correlation operation between an output signal of the phase difference detecting pixel cell 51L'(2) and an output signal of the phase difference detecting pixel cell 51R'(4) in the divided area A1 to calculate a phase difference amount for the divided area A1. Further, the phase difference information calculating unit 19 performs a correlation operation between an output signal of the phase difference detecting pixel cell 51L'(1) and an output signal of the phase difference detecting pixel cell 51R'(3) in the divided area A2 to calculate a phase difference amount for the divided area A2.

Finally, the phase difference information calculating unit 19 uses the phase difference amounts, which are calculated for the divided areas A1, A2, B1, and B2, to calculate phase difference information for the phase difference detecting region 50a, in the same manner as described above.

Further, when an imaged photographic subject has a strong blue tone (Ra<Ba) and an incident angle of the light, which is incident onto the solid state image capturing element, is larger than the threshold value, the phase difference information calculating unit 19 performs an operation in which (1) and (2) are switched and (3) and (4) are switched in FIG. 16. Further, when an imaged photographic subject has a strong blue tone (Ra<Ba) and an incident angle of the light, which is incident onto the solid state image capturing element, is equal to or smaller than the threshold value, the phase difference information calculating unit 19 performs an operation in which (1) and (2) are switched and (3) and (4) are switched in FIG. 17.

As described above, when a solid state image capturing element having the phase difference detecting pixel cells 51L'(1), 51L'(2), 51R'(3), and 51R'(4) is used as the solid state image capturing element 5 illustrated in FIG. 1, a correlation operation method which is performed for every divided area is determined in consideration of an angle of light which is incident onto the solid state image capturing element, in addition to the position of the divided area and a color tone of the photographic subject, so that phase difference information may be precisely calculated.

Further, in the solid state image capturing element mounted in the digital camera of the fourth exemplary embodiment, when a scaling which shifts the position of the PD 61 to the periphery as the position is directed from the center of the solid state image capturing element to the periphery thereof is not performed, the phase difference information calculating unit 19 may determine the correlation operation method for every divided area in accordance with the color tone of the photographic subject and the position of the divided area. For example, when Ra>Ba, the phase difference information calculating unit 19 may perform the correlation operation for every divided area, as illustrated in FIG. 16, and when Ra<Ba, the phase difference information calculating unit 19 may perform the correlation operation for every divided area, as illustrated in FIG. 17.

Further, even in the digital camera of the fourth exemplary embodiment, as described in the third embodiment, a color tone of the photographic subject and an incident angle of the light may be determined for every focus area to determine the correlation operation method for every divided area in accordance with the determination result.

Even though it has been described above that the color filter is mounted in the phase difference detecting pixel cell, since the phase difference detecting pixel cell only have to detect a phase difference, the color filter may be omitted.

Further, the color filter has primary colors, but may have complementary colors. Furthermore, the color filter may have four or more colors.

As described above, the present description discloses the following matters.

It is disclosed a solid state image capturing element in which a plurality of pixel cells each including a photoelectric converting unit is two dimensionally arranged, in which each of the plurality of pixel cells has a color filter which is formed above the photoelectric converting unit, and light which is transmitted through the color filters and is separated to at least three different colors, the plurality of pixel cells includes a plurality of image capturing pixel cells which receives a pair of light fluxes which pass through different pupil areas of an photographing optical system which is disposed at a stage preceding the solid state image capturing element, a plurality of phase difference detecting pixel cells which receives one of the light fluxes, and a plurality of phase difference detecting pixel cells which receives the other one of the light fluxes, the plurality of phase difference detecting pixel cells which receives said one of the light fluxes is divided into two types of a first phase difference detecting pixel cell and a second phase difference detecting pixel cell which have different arrangement patterns of the pixel cells adjacent to the phase difference detecting pixel cells, the plurality of phase difference detecting pixel cells which receives the other one of the light fluxes is divided into two types of a third phase difference detecting pixel cell and a fourth phase difference detecting pixel cell which have different arrangement patterns of the pixel cells adjacent to the phase difference detecting pixel cells, the arrangement pattern of the pixel cells adjacent to the first phase difference detecting pixel cell is the same as the arrangement pattern of the pixel cells adjacent to the third phase difference detecting pixel cell, and the arrangement pattern of the pixel cells adjacent to the second phase difference detecting pixel cell is the same as the arrangement pattern of the pixel cells adjacent to the fourth phase difference detecting pixel cell.

In the present description, when color filters respectively mounted in the pixel cells being adjacent to two of the phase difference detecting pixel cells in the same direction have the same color, the arrangement patterns of the pixel cells adjacent to the two of the phase difference detecting pixel cells are the same.

It is disclosed an image capturing apparatus, including: the solid state image capturing element; the photographing optical system; a phase difference information calculating unit which performs first processing which calculates phase difference information by a correlation operation between an output signal of the first phase difference detecting pixel cell and an output signal of the third phase difference detecting pixel cell, and second processing which calculates phase difference information by a correlation operation between an output signal of the second phase difference detecting pixel cell and an output signal of the fourth phase difference detecting pixel cell; and a focusing control unit which performs a focus control of the photographing optical system based on at least one of the phase difference information calculated by the first processing and the phase difference information calculated by the second processing.

It is disclosed the image capturing apparatus, in which in the solid state image capturing element, the first phase difference detecting pixel cell, the second phase difference detecting pixel cell, the third phase difference detecting pixel cell, and the fourth phase difference detecting pixel cell are periodically arranged for every divided area which is obtained by dividing a region of a light receiving surface of the solid state image capturing element in which the phase difference detecting pixel cells are arranged, the phase difference information calculating unit performs any one of the first processing and the second processing to calculate phase difference information, for every divided area, depending on a position of the divided area and a color tone of a photographic subject which is imaged by the solid state image capturing element, and the focusing control unit performs the focus control based on both the phase difference information calculated by the first processing and the phase difference information calculated by the second processing.

It is disclosed the image capturing apparatus, in which in the solid state image capturing element, first image capturing pixel cells and second image capturing pixel cells having different detection colors are arranged at both sides of the first phase difference detecting pixel cell and the third phase difference detecting pixel cell in predetermined directions, respectively, the first image capturing pixel cells and the second image capturing pixel cells are arranged at both sides of the second phase difference detecting pixel cell and the fourth phase difference detecting pixel cell in predetermined directions, respectively, the first phase difference detecting pixel cell, the second phase difference detecting pixel cell, the third phase difference detecting pixel cell, and the fourth phase difference detecting pixel cell are periodically arranged for every divided area which is obtained by dividing a region of the light receiving surface of the solid state image capturing element in which the phase difference detecting pixel cells are arranged, and the position of the photoelectric converting unit included in the pixel cell is shifted to get away from a center of the solid state image capturing element with respect to a center of the pixel cell as the position is directed from the center of the solid state image capturing element to the periphery thereof, the phase difference information calculating unit performs any one of the first processing and the second processing, for every divided area, depending on a position of the divided area, a color tone of a photographic subject which is imaged by the solid state image capturing element, and an incident angle of light which is incident onto the solid state image capturing element, and the focusing control unit performs the focus control based on both the phase difference information calculated by the first processing and the phase difference information calculated by the second processing.

It is disclosed the image capturing apparatus, in which the focusing control unit selects any one of the phase difference information calculated by the first processing and the phase difference information calculated by the second processing in accordance with a color tone of a photographic subject which is imaged by the solid state image capturing element, and performs the focus control based on the selected phase difference information.

It is disclosed the image capturing apparatus, in which in the solid state image capturing element, types of the image capturing pixel cells at both sides of the first phase difference detecting pixel cell and the third phase difference detecting pixel cell in predetermined directions, respectively, are the same as types of the image capturing pixel cells at both sides of the second phase difference detecting pixel cell and the fourth phase difference detecting pixel cell in directions orthogonal to the predetermined directions, in a region of the light receiving surface of the solid state image capturing element in which the phase difference detecting pixel cells are arranged, the first phase difference detecting pixel cell and the third phase difference detecting pixel cell are periodically arranged at an end in the predetermined direction, and the second phase difference detecting pixel cell and the fourth phase difference detecting pixel cell are periodically arranged at an end in a direction orthogonal to the predetermined direction, and the focusing control unit performs the focus control based on both the phase difference information calculated by the first processing and the phase difference information calculated by the second processing.

It is disclosed a focusing control method in an image capturing element which includes the solid state image capturing element and the photographing optical system, the method including: a first phase difference information calculating step of calculating phase difference information by a correlation operation between an output signal of the first phase difference detecting pixel cell and an output signal of the third phase difference detecting pixel cell; a second phase difference information calculating step of calculating phase difference information by a correlation operation between an output signal of the second phase difference detecting pixel cell and an output signal of the fourth phase difference detecting pixel cell; and a focus controlling step of performing a focus control of the photographing optical system based on at least one of the phase difference information calculated by the first phase difference information calculating step and the phase difference information calculated by the second phase difference information calculating step.

INDUSTRIAL APPLICABILITY

According to the present invention, it is possible to provide a solid state image capturing element which may prevent the accuracy of the phase difference detection from being degraded due to the influence of the mixed color, an image capturing apparatus including the same, and a focusing control method in the image capturing apparatus.

Although the present invention has been described in detail with reference to specific embodiments thereof, it is obvious to those skilled in the art that various changes or modifications may be made without departing from the spirit and scope of the present invention.

This application is based on Japanese Patent Application No. 2011-215643 filed on Sep. 29, 2011, the entire contents of which are incorporated herein by reference.

REFERENCE SIGNS LIST

5 Solid state image capturing element
50 Light receiving region
50a Phase difference detecting region
51L, 51R Phase difference detecting pixel cell

The invention claimed is:

1. A solid state image capturing element comprising: a plurality of pixel cells, which are two-dimensionally arranged, each including only one photoelectric converting unit;
wherein each of the plurality of pixel cells has a color filter which is formed above the photoelectric converting unit, and light which is transmitted through the color filters and is separated to at least three different colors;
the plurality of pixel cells includes a plurality of image capturing pixel cells which receives a pair of light fluxes which pass through different pupil areas of a photographing optical system which is disposed at a stage preceding the solid state image capturing element, a plurality of phase difference detecting pixel cells which receives one of the light fluxes, and a plurality of phase difference detecting pixel cells which receives the other one of the light fluxes;
the plurality of phase difference detecting pixel cells which receives said one of the light fluxes is divided into two types of a first phase difference detecting pixel cell and a second phase difference detecting pixel cell which have different arrangement patterns of the pixel cells adjacent to the first and second phase difference detecting pixel cells;
the plurality of phase difference detecting pixel cells which receives the other one of the light fluxes is divided into two types of a third phase difference detecting pixel cell and a fourth phase difference detecting pixel cell which have different arrangement patterns of the pixel cells adjacent to the third and fourth phase difference detecting pixel cells;
the arrangement pattern of the pixel cells adjacent to the first phase difference detecting pixel cell is the same as the arrangement pattern of the pixel cells adjacent to the third phase difference detecting pixel cell; and
the arrangement pattern of the pixel cells adjacent to the second phase difference detecting pixel cell is the same as the arrangement pattern of the pixel cells adjacent to the fourth phase difference detecting pixel cell.

2. An image capturing apparatus, comprising:
the solid state image capturing element of claim 1;
the photographing optical system;
a phase difference information calculating unit which performs first processing which calculates phase difference information by a correlation operation between an output signal of the first phase difference detecting pixel cell and an output signal of the third phase difference detecting pixel cell, and second processing which calculates phase difference information by a correlation operation between an output signal of the second phase difference detecting pixel cell and an output signal of the fourth phase difference detecting pixel cell; and
a focusing control unit which performs a focus control of the photographing optical system based on at least one of the phase difference information calculated by the first processing and the phase difference information calculated by the second processing.

3. The image capturing apparatus of claim 2, wherein in the solid state image capturing element, the first phase difference detecting pixel cell, the second phase difference detecting pixel cell, the third phase difference detecting pixel cell, and the fourth phase difference detecting pixel cell are periodically arranged for every divided area which is obtained by dividing a region of a light receiving surface of the solid state image capturing element in which the phase difference detecting pixel cells are arranged;
the phase difference information calculating unit performs any one of the first processing and the second processing to calculate phase difference information, for every divided area, depending on a position of the divided area and a color tone of a photographic subject which is imaged by the solid state image capturing element; and
the focusing control unit performs the focus control based on both the phase difference information calculated by the first processing and the phase difference information calculated by the second processing.

4. The image capturing apparatus of claim 2, wherein in the solid state image capturing element, first image capturing pixel cells and second image capturing pixel cells having different detection colors are arranged at both sides of the first phase difference detecting pixel cell and the third phase difference detecting pixel cell in predetermined directions, respectively, the first image capturing pixel cells and the second image capturing pixel cells are arranged at both sides of the second phase difference detecting pixel cell and the fourth phase difference detecting pixel cell in predetermined directions, respectively, the first phase difference detecting pixel cell, the second phase difference detecting pixel cell, the third phase difference detecting pixel cell, and the fourth phase difference detecting pixel cell are periodically arranged for every divided area which is obtained by dividing a region of the light receiving surface of the solid state image capturing element in which the phase difference detecting pixel cells are arranged, and the position of the photoelectric converting unit included in the pixel cell is shifted to get away from a center of the solid state image capturing element with respect to a center of the pixel cell as the position is directed from the center of the solid state image capturing element to the periphery thereof;

the phase difference information calculating unit performs any one of the first processing and the second processing, for every divided area, depending on a position of the divided area, a color tone of a photographic subject which is imaged by the solid state image capturing element, and an incident angle of light which is incident onto the solid state image capturing element; and the focusing control unit performs the focus control based on both the phase difference information calculated by the first processing and the phase difference information calculated by the second processing.

5. The image capturing apparatus of claim 2, wherein the focusing control unit selects any one of the phase difference information calculated by the first processing and the phase difference information calculated by the second processing in accordance with a color tone of a photographic subject which is imaged by the solid state image capturing element, and performs the focus control based on the selected phase difference information.

6. The image capturing apparatus of claim 2, wherein in the solid state image capturing element, types of the image capturing pixel cells at both sides of the first phase difference detecting pixel cell and the third phase difference detecting pixel cell in predetermined directions, respectively, are the same as types of the image capturing pixel cells at both sides of the second phase difference detecting pixel cell and the fourth phase difference detecting pixel cell in directions orthogonal to the predetermined directions;

in a region of the light receiving surface of the solid state image capturing element in which the phase difference detecting pixel cells are arranged, the first phase difference detecting pixel cell and the third phase difference detecting pixel cell are periodically arranged at an end in the predetermined direction, and the second phase difference detecting pixel cell and the fourth phase difference detecting pixel cell are periodically arranged at an end in a direction orthogonal to the predetermined direction; and the focusing control unit performs the focus control based on both the phase difference information calculated by the first processing and the phase difference information calculated by the second processing.

7. A focusing control method in an image capturing element which includes the solid state image capturing element and the photographing optical system of claim 1, the method comprising:

a first phase difference information calculating step of calculating phase difference information by a correlation operation between an output signal of the first phase difference detecting pixel cell and an output signal of the third phase difference detecting pixel cell;

a second phase difference information calculating step of calculating phase difference information by a correlation operation between an output signal of the second phase difference detecting pixel cell and an output signal of the fourth phase difference detecting pixel cell; and a focus controlling step of performing a focus control of the photographing optical system based on at least one of the phase difference information calculated by the first phase difference information calculating step and the phase difference information calculated by the second phase difference information calculating step.

\* \* \* \* \*